(12) United States Patent
 Bavastro

(10) Patent No.: US 12,694,164 B2
(45) Date of Patent: Jul. 28, 2026

(54) SYSTEM FOR GENERATING VISUALIZATIONS WITH APPLICATIONS FOR INSURANCE AND REINSURANCE

(71) Applicant: Frederic Bavastro, Monaco (MC)

(72) Inventor: Frederic Bavastro, Monaco (MC)

( * ) Notice: Subject to any disclaimer, the term of this patent is extended or adjusted under 35 U.S.C. 154(b) by 121 days.

(21) Appl. No.: 18/507,483

(22) Filed: Nov. 13, 2023

(65) Prior Publication Data

US 2024/0078351 A1 Mar. 7, 2024

Related U.S. Application Data

(63) Continuation-in-part of application No. 17/748,224, filed on May 19, 2022, now Pat. No. 11,816,395, (Continued)

(51) Int. Cl.
 *G06F 30/12* (2020.01)
 *G06F 30/13* (2020.01)
 (Continued)

(52) U.S. Cl.
 CPC .............. *G06F 30/12* (2020.01); *G06F 30/13* (2020.01); *G06T 17/10* (2013.01); *G06T 19/006* (2013.01);
 (Continued)

(58) Field of Classification Search
 CPC ......... G06F 30/12; G06F 30/13; G06V 20/20; G06V 10/40; G06V 30/19173;
 (Continued)

(56) References Cited

U.S. PATENT DOCUMENTS 6,295,066 B1 9/2001 Tanizak et al.
7,523,411 B2 4/2009 Carlin
 (Continued)

FOREIGN PATENT DOCUMENTS

CA 314605 A1 6/2023
EP 3489909 5/2019
 (Continued)

OTHER PUBLICATIONS

Beom-Soo Oh et al., Progressive 3D Reconstruction from a Sketch Drawing, Computer Graphics and Applications, 2001. Proceedings. Ninth Pacific Conference on Oct. 16-18, Oct. 16, 2001, pp. 108-117, ISBN: 978-0-7695-1227-3, Piscataway, NJ, USA.
 (Continued)

*Primary Examiner* — Abderrahim Merouan
(74) *Attorney, Agent, or Firm* — Cherskov Flaynik & Gurda, LLC

(57) ABSTRACT

A system for verifying insurance coverage is described. A central system receives an address of a property into a central system including information about insurance products for a premises. The central system retrieves an informal two-dimensional rendering of the premises from at least one external data store. The central system analyzes said informal two-dimensional rendering. The central system determines features found on the premises depicted by the two-dimensional rendering, wherein said features comprise walls, doors, windows, and appliances. The central system automatically generates a three-dimensional model of the premises on demand using only the two-dimensional rendering of the premises. The central system verifies insurance coverage for the property using the three-dimensional model.

22 Claims, 15 Drawing Sheets

Related U.S. Application Data which is a continuation of application No. 17/217, 521, filed on Mar. 30, 2021, now Pat. No. 11,341,721, which is a continuation of application No. 16/533, 993, filed on Aug. 7, 2019, now Pat. No. 10,977,859, which is a continuation-in-part of application No. 15/822,070, filed on Nov. 24, 2017, now Pat. No. 10,580,207.

(51) Int. Cl.

| | |
|---|---|
| *G06T 17/10* | (2006.01) |
| *G06T 19/00* | (2011.01) |
| *G06V 10/40* | (2022.01) |
| *G06V 20/20* | (2022.01) |
| *G06V 30/19* | (2022.01) |
| *G06V 30/422* | (2022.01) |

(52) U.S. Cl.
CPC .............. *G06V 10/40* (2022.01); *G06V 20/20* (2022.01); *G06V 30/19173* (2022.01); *G06T 2200/24* (2013.01); *G06T 2210/04* (2013.01); *G06V 30/422* (2022.01)

(58) Field of Classification Search
CPC ..... G06V 30/422; G06T 17/10; G06T 19/006; G06T 2200/24; G06T 2210/04
See application file for complete search history.

(56) References Cited

U.S. PATENT DOCUMENTS

| | | | |
|---|---|---|---|
| 7,586,490 | B2 | 9/2009 | McDaniel |
| 7,876,317 | B2 | 1/2011 | Zhang et al. |
| 8,395,614 | B2 | 3/2013 | Mikhailov |
| 8,606,657 | B2 | 12/2013 | Chesnut et al. |
| 8,791,942 | B2 | 7/2014 | Rivers et al. |
| 8,793,108 | B2 | 7/2014 | Fu et al. |
| 8,994,726 | B1 | 3/2015 | Furukawa et al. |
| 9,335,909 | B2 | 5/2016 | Sabanai et al. |
| 9,355,470 | B2 | 5/2016 | Merrell et al. |
| 9,536,340 | B2 | 1/2017 | Loberg |
| 10,453,147 | B1 * | 10/2019 | Davis ..................... G06Q 40/08 |
| 10,572,947 | B1 * | 2/2020 | Berends ............... G06Q 50/163 |
| 10,755,357 | B1 * | 8/2020 | Davis ................... G06Q 50/163 |
| 11,138,669 | B1 * | 10/2021 | Doyle .................... G06Q 40/08 |
| 11,373,257 | B1 * | 6/2022 | Guo ....................... G06N 20/00 |
| 11,393,198 | B1 | 7/2022 | Little et al. |
| 11,532,051 | B1 * | 12/2022 | Braun ................... G06Q 40/08 |
| 11,562,143 | B2 | 1/2023 | Priestas et al. |
| 11,657,912 | B2 | 5/2023 | Dunn et al. |
| 11,816,395 | B2 * | 11/2023 | Bavastro .......... G06V 30/19173 |
| 2002/0067354 | A1 | 6/2002 | Oh et al. |
| 2002/0180726 | A1 | 12/2002 | Shi et al. |
| 2004/0236561 | A1 | 11/2004 | Smith et al. |
| 2005/0073303 | A1 | 4/2005 | Harer et al. |
| 2005/0081161 | A1 | 4/2005 | Macinnes et al. |
| 2006/0082571 | A1 | 4/2006 | McDaniel |
| 2006/0143221 | A1 | 6/2006 | Zhang |
| 2007/0285668 | A1 | 12/2007 | Bertola et al. |
| 2008/0175493 | A1 | 7/2008 | Katougi |
| 2009/0102835 | A1 | 4/2009 | Mikhailov |
| 2009/0144173 | A1 | 6/2009 | Mo et al. |
| 2011/0175916 | A1 | 7/2011 | Noris et al. |
| 2012/0050046 | A1 | 3/2012 | Satorius |
| 2013/0179841 | A1 | 7/2013 | Mutton et al. |
| 2013/0259308 | A1 | 10/2013 | Klusza et al. |
| 2013/0262041 | A1 | 10/2013 | Fu |
| 2014/0149151 | A1 * | 5/2014 | Chen .................. G06Q 10/0635 705/4 |
| 2014/0172378 | A1 | 6/2014 | Shim et al. |
| 2014/0267717 | A1 * | 9/2014 | Pitzer ................... G01C 15/002 703/1 |
| 2014/0358617 | A1 | 12/2014 | Lepage |
| 2015/0193972 | A1 | 7/2015 | Algreatly |
| 2015/0302639 | A1 | 10/2015 | Malekian |
| 2016/0110916 | A1 | 4/2016 | Eikhoff |
| 2016/0180265 | A1 * | 6/2016 | Yanicke ................. G06Q 50/40 705/7.28 |
| 2016/0210377 | A1 | 7/2016 | Bumbalough et al. |
| 2016/0300392 | A1 | 10/2016 | Jonczyk et al. |
| 2017/0091885 | A1 | 3/2017 | Randolph |
| 2017/0105129 | A1 | 4/2017 | Teplin et al. |
| 2017/0256096 | A1 * | 9/2017 | Faaborg ............... G06T 19/003 |
| 2017/0287447 | A1 | 10/2017 | Barry et al. |
| 2017/0332203 | A1 | 11/2017 | Nagpal et al. |
| 2017/0363863 | A1 | 12/2017 | Chen |
| 2018/0061084 | A1 | 3/2018 | Mitchell et al. |
| 2018/0061116 | A1 | 3/2018 | Mitchell et al. |
| 2018/0335307 | A1 * | 11/2018 | Chen ...................... G01C 21/32 |
| 2019/0228115 | A1 | 7/2019 | Bergin |
| 2019/0362545 | A1 | 11/2019 | Pejic |
| 2020/0126641 | A1 | 4/2020 | Li et al. |
| 2021/0217236 | A1 | 7/2021 | Bavastro et al. |
| 2022/0277518 | A1 * | 9/2022 | Bavastro ................. G06F 30/12 |
| 2024/0078351 | A1 * | 3/2024 | Bavastro ................. G06T 7/543 |

FOREIGN PATENT DOCUMENTS

| | | |
|---|---|---|
| WO | WO 2004010384 A2 | 1/2004 |
| WO | WO 2016061267 A1 | 4/2016 |
| WO | 2021023812 A1 | 2/2021 |

OTHER PUBLICATIONS

Philippe Dosch et al., Reconstruction of the 3D Structure of a Building from the 2D Drawings of its Floors, Document Analysis and Recognition, 1999, ICDAR '99. Proceedings of the Fifth International Conference on Bangalore, India Sep. 20-22, 1999, Sep. 20, 1999, pp. 487-490, ISBN: 978-0-7695-0318-9, Los Alamitos, CA, USA.

International Search Report and Written Opinion dated Nov. 11, 2020 of International Application No. PCT/EP2020/072125 (14 pages).

Stefan Streit, International Search Report and Written Opinion dated Jan. 27, 2025 of International Application No. PCT/IB2024/061061 (13 pages).

\* cited by examiner

SYSTEM FOR GENERATING VISUALIZATIONS WITH APPLICATIONS FOR INSURANCE AND REINSURANCE

PRIORITY CLAIM

The instant application claims priority as a continuation of U.S. application Ser. No. 17/217,521, filed on Mar. 30, 2021, presently pending, which in turn claimed priority as a continuation of U.S. application Ser. No. 16/533,993, filed on Aug. 7, 2019, issued as U.S. Pat. No. 10,977,859 on Apr. 13, 2021, which in turn was a continuation in part of U.S. application Ser. No. 15/822,070 filed on Nov. 24, 2017, registered as U.S. Pat. No. 10,580,207 on Mar. 3, 2020. The contents of each application are hereby incorporated by reference.

BACKGROUND OF THE INVENTION

1. Field of the invention

This invention is directed to a method and system for aiding in design using augmented reality and virtual reality components.

2. Background of the Invention

Many design tasks have seen only incremental improvements stemming from computerization. On the one hand, computerization has ended the days of manual drafting and re-drafting of designs. On the other hand, the steps which occur before the design stage are not significantly different than they would have been without a computer. Mainly, a rough sketch is entered into a formal system which then proceeds to perform the three-dimensional modeling.

The entry of the initial design idea into a system is a considerable obstacle. The end-user of the design software must become competent in the use of the software. Different vendors take various approaches to the design input stage, and some are more successful at simplifying the task than others. However, the task of inputting the initial model of the design is an ever-present obstacle to many users beginning work on their design.

One area where this is apparent is interior design software. While the operation details have changed, and some features such as three-dimensional modeling are quite impressive, inevitably, the user of such design software is presented with a blank page at the start. It is up to the end-user to draft within the software the dimensions of the rooms, the placement of windows and doors, and so forth.

These initial steps have not changed since the first interior design software packages became available for sale on the market decades ago. Many users are discouraged when facing such a blank page. Other users that persevere and attempt to use the software may inadvertently use the design tools in an unintended way, resulting in a design that is frustratingly incorrect or entirely impossible. The system will attempt to model a design that does not follow best practices, is not safe, or is not commercially feasible. Users who invest considerable time to learn design software only to find out the resulting design is ineffectual will be discouraged from using any tool in the future.

Previous attempts to solve this problem relied on ready-made templates, which users then customize. While this solution will provide the users guidance to begin the work, it does not overcome the problems associated with learning an unfamiliar system. An additional tradeoff is that the users no longer have full flexibility in their design without first extensively customizing the provided template. This significantly decreases the benefit of the design software. Eventually, in order to be able to create a design that reflects the user's ideas, the users must either significantly customize the starting template or re-work the design using the system input tools.

Therefore, a need exists in the art for a system to simplify the process of entering information into a software package. The system and method should use intuitive methods for every aspect of the design process, from adding the initial input to adding details to the initial input, and finally to revising the final design.

SUMMARY OF THE INVENTION

An object of the present invention is to provide a designer system and method that overcomes many of the limitations of the prior art.

A further object of the present invention is to provide a system that generates formal designs. A feature of the present invention is that several input sources are combined to arrive at a formal design. An advantage of the present invention is that no single input method is required to create a final design.

Another object of the present invention is to provide a system and method for saving time during the design process. A feature of the present invention is that the method automates several design input tasks. An advantage of the present invention is that the end-user of the system can be presented with a design input in a limited amount of time.

Another object of the present invention is to provide a system and method that does not require prior knowledge of computer-aided design software. A feature of the present invention is that the software accepts input from the user in an informal way without requiring the user to learn how to manipulate the input design within the software. An advantage of the present invention is that the end-user may begin interacting with the software's analysis tools without first learning how to input the design into the software.

An additional object of the present invention is to provide a system and method that allows an end-user to input a design into the software without becoming familiar with the rules of design within a particular area. A feature of the present invention is that the software analyses the end-user's input and provides feedback regarding compliance with best design practices. An advantage of the present invention is that the software highlights best design practices for the end-user as each best practice or industry standard is relevant to the end-user's design.

Another object of the present invention is to provide a system and method of inputting a design to a computer-aided design package using intuitive mechanisms. A feature of the present invention is that an informal sketch by the user is used as the initial input of the design. An advantage of the present invention is that it obviates the need for formal input by the user.

A further object of the present invention is to allow the end-user to sketch an informal design away from a computer. A feature of the invention is that the informal sketch may be provided to the system as a photograph of a line drawing or a scan of a sketch on paper. An advantage of the present invention is that the end-user does not have to draw the sketch on a computer screen nor does the invention require the use of a touch screen. Instead, the input occurs in a method most familiar for the end-user and the most comfortable for the end-user.

Another object of the present invention is to provide a system that operates in any convenient form factor. A feature of the invention is that its interface is presented as a mobile application, in one embodiment. An advantage of the present invention is that designs created within the system can be worked on anywhere the end-user has access to, even a small-screen mobile device.

A further object of the invention is to provide a three-dimensional model of the input design. A feature of the invention is that the informal input sketch by the end-user is converted to a three-dimensional model of the design. An advantage of the invention is that system converts a rough sketch into a computer-readable 3d model.

A further object of the invention is to provide a means to confirm the three-dimensional model. A feature of the system is that in one embodiment, the system-generated 3d model is superimposed using augmented reality back on the sketch by the end-user. An advantage of the system is that the end-user can see how the 3d model corresponds to the features drawn on the initial informal sketch.

A further object of the invention is to provide a means to refine the design throughout the process. A feature of one embodiment of the system is that previews of iterations of the design are shown to the user, and the user is provided with an opportunity to update the design. An advantage of the system is that the end-user will not waste time modeling or otherwise undertaking a detailed design that has unintended features or other errors.

A further object of the invention is to provide an environment to finalize a design. A feature of one embodiment of the system is that all design elements can be added within the system as appropriate to the task. For example, where the system is modeling a residential property, the system includes a facility to add furniture to the 3d model. An advantage of the system is that it supports detailed designs using custom and pre-existing components.

An additional object of the system is to facilitate the creation of a final design. A feature of the system is that it provides suggestions to the end-users on how to finalize the design. An advantage of the system is that it provides the end-users with multiple choices for feature designs and suggests certain options depending on user preferences.

A further object of the system is to provide a means for the end-user to interact with the final design. A feature of the system is that it generates a photorealistic virtual reality review of a finalized design. An advantage of the system is that it provides a customizable virtual reality environment for the final design.

An additional benefit of the system is that it provides manufacturers with an easy way to showcase products suitable for an end-user's design. A feature of the invention is that it provides promotions of certain third-party products within the design environment. A benefit of the system is that it allows for additional exposure for third-party products by customers currently engaged in design tasks.

Briefly, the present invention provides a system for designing an environment, the system comprising inputting into the system an informal two-dimensional rendering of the premises; analyzing said informal two-dimensional rendering; determining features found on the premises depicted by the two-dimensional rendering; generating a three-dimensional model of the premises; populating said three-dimensional rendering with interactive objects; and providing multiple views of the three-dimensional rendering containing interactive objects.

BRIEF DESCRIPTION OF THE DRAWINGS

The invention, together with the above and other objects and advantages, will be best understood from the following detailed description of the preferred embodiment of the invention shown in the accompanying drawings, wherein.

DETAILED DESCRIPTION OF THE INVENTION

The foregoing summary, as well as the following detailed description of certain embodiments of the present invention, will be better understood when read in conjunction with the appended drawings.

As used herein, an element step recited in the singular and preceded with the word "a" or "an" should be understood as not excluding plural said elements or steps, unless such exclusion is explicitly stated. Furthermore, the references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

As described herein, one embodiment of the system comprises a designer of interior habitable spaces. However, the same design strategies can be used for any design task, including interior spaces, exteriors of buildings, design of new consumer products, the design of circuit elements, and other tasks.

Overview

Figure 1:
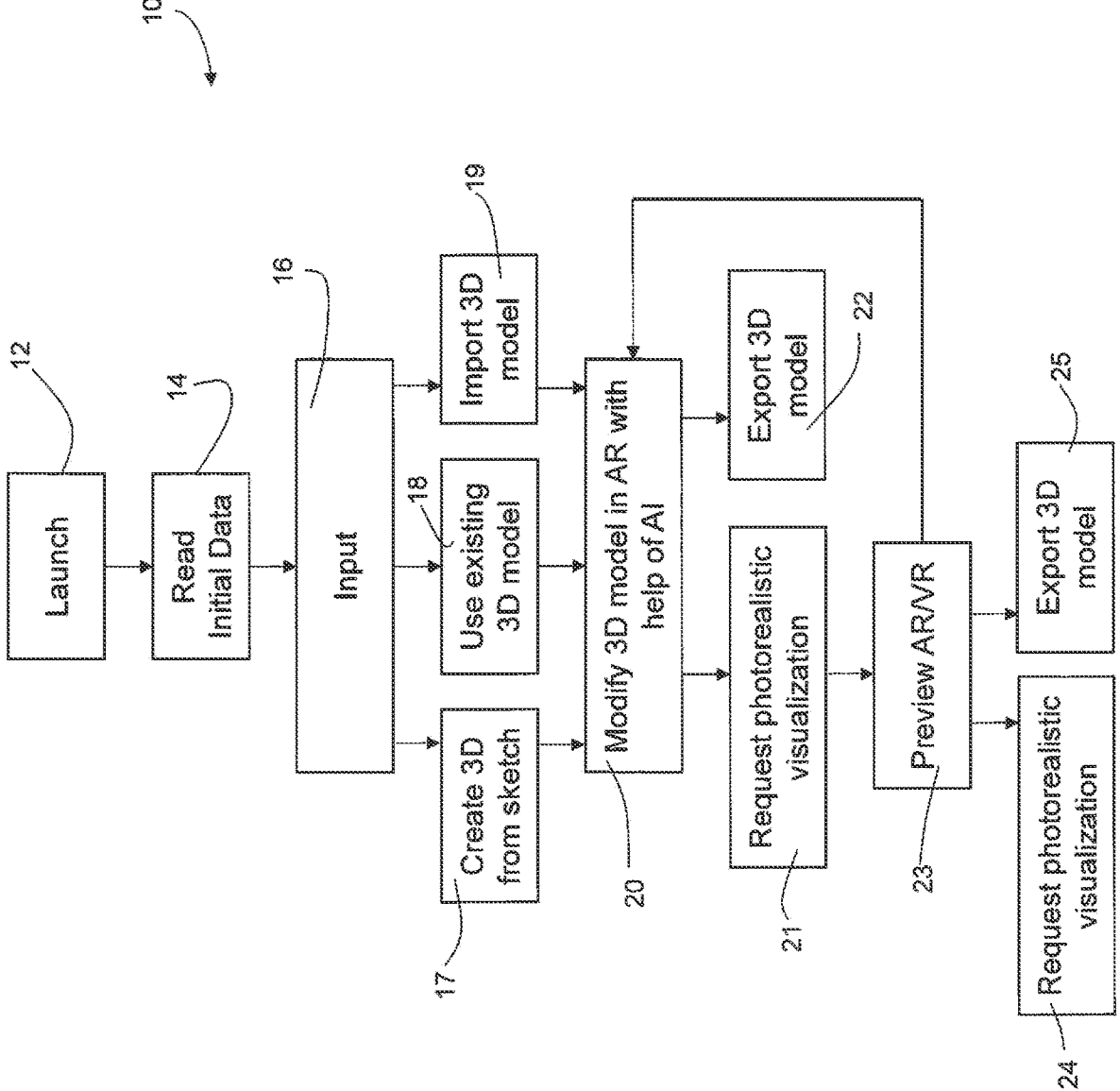
FIG. 1 is a flow chart describing the operation of one embodiment of the present invention.

An overview of the system is shown in the flowchart depicted in FIG. 1. The system comprises computer-readable software which is loaded on a suitable device. Suitable devices include portable computers, cellular phones, tablets, and other similar devices, which include input and output devices. In the embodiment described herein, the device must have access to an imaging device, such as a camera or a scanner.

Further, the embodiment described herein includes both a user-interactive component and a server-side component, each of which will be described below.

The operation of the system 10 begins with the launch 12 step. As part of the launch 12 step, the system 10 ensures that the user-interactive component is authorized for use, the software is up to date, and is properly installed on compatible hardware. In one embodiment, the launch 12 step includes a check to ensure that the system is being used in an authorized geographical region, and also has access to all the necessary server-side components. Following initialization, the system loads user settings. In one embodiment, the user settings are provided in a second data store, such as a cloud-based account. In another embodiment, the user settings are requested from the user at the time the application is installed.

Subsequently, the system 10 reads initial data 14. The initial data reading step 14 includes accessing both the local storage on the device presenting the user-interactive component and communicating with the server-side component to determine if the authorized user has uploaded any designs in progress to the server. The initial data 14 comprises built-in templates, object information, and information on modeling walls, doors, and windows, in one embodiment.

Once the system 10 completes the initialization step 14, the user is provided with an opportunity to either resume work on an existing design or begin a new design. If the user wishes to begin a new design, the user is asked to input 16 the basic parameters of the design. In one embodiment, the input step 16 comprises the user placing the image capture device over a rough sketch of the system to be modeled, as described in step 17. In another mode, the input step 16 comprises providing the system 10 with an image file containing a scan of the sketch by the end-user.

The photo of the sketch or the scan of the sketch must include sufficient detail for the system 10 to process the image information during the input step 17. In one embodiment, the minimum requirement for a camera-captured image is that it contains at least 4 megapixels of information, with each boundary comprising at least 20 pixels of high contrast data. For a scan of the sketch, the system requires an image scanned with at least 300 dpi and no more than 1200 dpi.

In one embodiment, the photo should be taken no more than 12 inches above the paper sketch of the design. In one embodiment, in order to be accepted, the sketch must fill at least 80% of the image area of the photo.

In one embodiment during the input step 17, the user is provided feedback if the image to be used for input is of a sufficient quality, including image features such as contrast, sharpness, and quantity of details necessary for augmented reality presentation, as discussed herein.

In one embodiment, the system 10 requires the user to provide a single image of a sketch. In another embodiment, the system 10 accepts a series of images, such as a video stream and performs the subsequent steps for each significantly altered frame of the video. This provides the user an opportunity to review the proposed detected designs to ensure which one is the best approximation of the user's intended design.

A common feature to these embodiments is that the end-user provides the initial sketch in a physical medium and not directly in the system 10. Thus, the end-user is never faced with a simple 'blank canvas' approach of other design programs. The input step 17 of the system 10 is, in this way also tied to a particular physical-world object—the sheet of paper that the end-user uses to perform the initial sketch.

As shown in the flow chart of FIG. 1, the input step 16 operates in three modes: as described above the input 16 can operate in the sketch input mode 17, wherein a three-dimensional model is created from a physical sketch. Alternatively, the end-user may use an existing model in another mode 18. The existing model step 18 is used when the end-user is provided with an apartment that had been modeled by a third party. For example, in one embodiment of the system 10, the user is provided with an existing 3d model when the user scans a bar code provided by a developer of a property. In a third mode 19, the end-user can import a 3d model from another source, such as a website or a 3d model provided by a professional.

Process for Creating the Preliminary Three-Dimensional Model

As mentioned above, as part of sketch input step 17, the end-user can create a 3d model from a two-dimensional sketch. The details of this process are as follows:

The starting point for this process is an informal physical sketch, which is provided to the system as a digital image (*.jpg or *.png file format).

Image is then converted to a numerical matrix, where each pixel of an input image is converted to a number. In the process of converting, the system reads the color value, and based on starting criteria defined for wall color (usually black or gray-almost black), the system transforms pixel to a corresponding number.

Then the system performs analysis on the matrix of values.

First, the system uses a search algorithm to go through the matrix in order to find a field which is potentially part of a wall. In one embodiment, this requires the system to iterate over the values of the matrix, searching for numbers that are used for wall marking. The output of the first step is a determination of potential wall positions represented in the image data matrix.

Second, following the completion of the search algorithm, the system performs a check of thickness. If the thickness of that part is sufficient, the system considers that sufficiently thick line to represent a starting point of the wall. In one embodiment, the minimal thickness to designate a wall is determined on the basis of matrix resolution and scale of starting informal drawing.

Next, the algorithm tracks the matrix field with desired numbers in order to find the contours of all walls.

After all potential walls are located, the algorithm will search for windows and door patterns connected to walls.

When all floor plan elements are determined, the system begins the space analysis.

First, the system determines all separated spaces inside the floor plan (all separated rooms).

Second, the system calculates their area (how many square meters) and determines which of them are connected to outside of the apartment/house, and which is connected with another room.

Next, based on industrial standards of space size, and connections the system predicts the type of each room. The system assigns a potential name for each of them (kitchen, living room . . . ), in one embodiment. The end-user then can confirm or change detected space names.

In this way, the system gives feedback if something is not right, like a small space for a specific type of room or missing doors resulting in isolated rooms.

At the end, on the basis of detected floor plan elements, the system creates a simple 3D model of walls with doors and windows and writes the name of each room. This completes the sketch input step 17.

Modification Steps

Once one of the potential input steps 17-19 is completed, the system 10 moves on to the step 20 of modifying the layout using augmented reality. The end-user is presented with a preliminary three-dimensional model of the design. The user is provided with an opportunity to accept the preliminary model or reject it, resulting in the system returning to the input step 16.

In one embodiment, if during the layout confirmation step 20 the end-user rejects the preliminary model, the end-user is asked to provide feedback as to the reasons for the rejection of the preliminary design. The created three-dimensional model is thereafter erased from the device memory, and the user is transferred to the first screen of the application in one embodiment.

Following the acceptance of the preliminary design during the confirmation step 20, the system 10 begins finalization of the design by the addition of all design elements. The detection step comprises the system 10 reviewing the preliminary model to determine significant features of the design, such as rooms, the purpose of each room, and the likely location of structural features such as columns and structural beams. The output of this step is only a 3d model of the structures—windows and door placements are determined in the initial sketch analysis step.

In one embodiment, the detection step also analyzes the preliminary model to determine the likely design choices given the information available about the user provided in the initial read data step 14. For example, if the designer is a family with a young child, the suggested design will include features designed to be age-appropriate. Artificial intelligence supports user choice on the basis of the user's preferences in one embodiment. In one embodiment, the program offers the user a choice from several interior design images in order to determine the user's preferences. In this embodiment, the system suggests to the user which furniture to include, which color of a wall, type of floor, based on the user's earlier preferred final design. Also when the user chooses one preferred piece of furniture, for example a sofa, the AI suggests to the end-user coffee tables which matches the materials, style, color and other attributes of the selected sofa. The end-users selections are recorded in the machine learning system and are used to generate further suggestions in future choices in one embodiment.

Once modification step 20 is completed, the end-user may export the three-dimensional model 22 or may request a photorealistic visualization 21 of the premises.

In one embodiment of the system 10, an augmented reality feature is included. It superimposes both the preliminary design (the output of the modification step 20) on the original sketch which was used in the input step 16. In this way, the end-user may confirm that both the preliminary design and the final three-dimensional design are as the user intended.

In one embodiment of the system 10, the final design is previewed 23 in augmented reality against the sketch on the sheet, as discussed herein. During the review the user can review the design and make additional changes. As the review is done using Augmented Reality, the user can intuitively see the 3D model on the top of the sketch. Simple rotation of sketch will rotate all aspects of the 3D model, zoom in and zoom out is done by going closer and further from sketch. During this Augmented Reality Review, the user without previous knowledge of complex 3D program commands can manipulate the 3D model. The user is able to change furniture (with several choices available from a data store) or change color, texture, position or orientation in Augmented Reality scene. This embodiment is compatible both with hand-held AR systems and head-mounted AR systems. In another embodiment, the system 10 includes a virtual reality confirmation feature. In this embodiment, the user, wearing a suitable virtual reality headset or using a VR 360 presentation on a single device screen, can view both the preliminary design and the final three-dimensional design. In one embodiment, the virtual reality feature is integrated into the client-interface application and runs on a single multi-purpose device such as a smartphone, which is interfaces with an optional virtual reality headset. In one embodiment, the user relies on Augmented Reality to perform preliminary design and manipulate same. In order to see the final design user needs to request final photorealistic visualization, the virtual reality feature is invoked. However, as the 3d model must be rendered remotely using high-performance computing resources. Even if it does not require remote computing power, this processing will take some time, as such the virtual reality confirmation is used only for the final design, in one embodiment. The photorealistic final design is delivered as AR photorealistic 3D model, or 360 VR virtual tour, in one embodiment.

During the review of the three-dimensional model step 20, the system 10 also populates the environment and design with interactive objects, as will be described below.

In one embodiment, the population stage includes proposing to the end-user various design components, such as floor and wall decoration, suitable to each detected room type. For example, different floor choices will be suggested for a bathroom than a living room.

The population phase also includes the addition of interactive objects, such as furniture. In one embodiment, the system shows the end-user furniture from a particular collection or supplier, depending on the sponsorship of the client-side application. All objects presented by the system 10 to the end-user are intended to be interactive in that their physical properties can be changed, and they may be used while the system is in the virtual reality or augmented reality preview mode.

Once the end-user has accepted a design, the final version of the design is presented during the photorealistic visualization step 24. The final design may be examined as part of a virtual reality review or can be projected back onto the input design using an augmented reality preview mode. Alternatively, or in conjunction with the photorealistic visualization, the end-user may also export the extended three-dimensional model 25.

Detection and Analysis Step

Figure 2B:
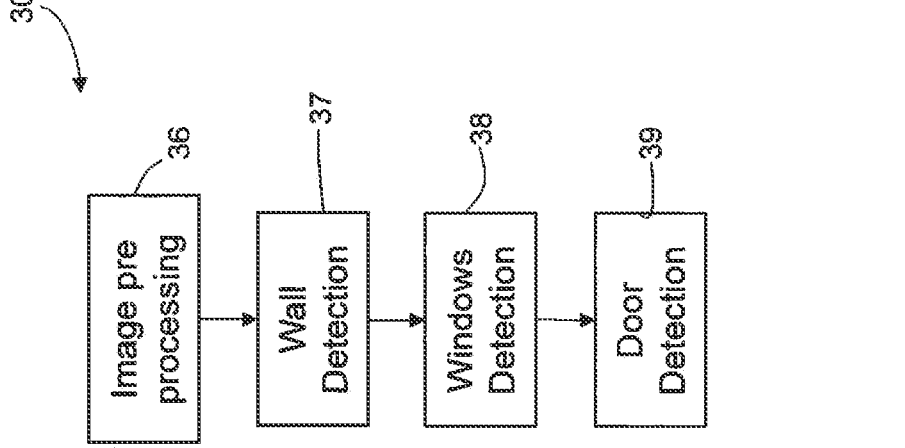
FIGS. 2A and 2B depict flow charts describing the details of the design modification step, in accordance with the features of the present invention.
Figure 2A:
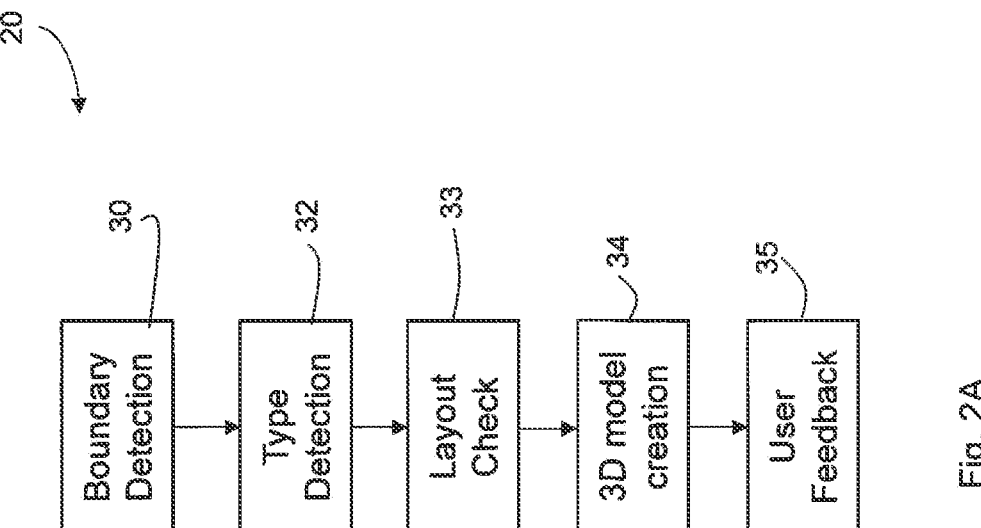

The details of the design input step 20 are shown in FIG. 2A. The design modification step 20 takes as input the preliminary model that the end-user has confirmed as part of one of the input steps 17-19.

The first phase in the detection step is boundary detection 30. The system 10 determines where the bounds of the design are, including the walls of each room, the locations of windows in each room (as depicted on the users' sketch), and the connecting interior doors in each room.

The detection step 20 also includes a detection of the type of each room 32. In one embodiment, the possible types include living room, bedroom, dining room, kitchen, bathroom, storage, office, and others. The users are asked to confirm the system detection, in one embodiment.

After determining the likely type of each room in stage 32, the system 10 performs a series of layout checks 33. The system will ensure that the layout does not have unintended features, such as dead space, rooms open to each other that likely should not be connected to one another (such as a bathroom that transitions to another room), and other likely design errors. For example, the system 10 as part of the layout check stage 33 will ensure that no hallway is narrower than a minimum size or that each bedroom has sufficient space for a bed and also storage.

Once the layout has been checked, the system 10 generates or updates a three-dimensional model as part of the update step 34.

Following the detection step 32 and the layout check step 33, the system 10 requests user feedback 35. This user feedback step 35 occurs at the end of the detection and analysis phase 20, in one embodiment. In another embodiment, the feedback step 35 occurs in an iterative fashion throughout the design process. In yet another embodiment, the feedback step 35 occurs whenever the system 10 makes a decision on behalf of the end-user with regards to one of the design choices.

The output of the detection and analysis step 20 is the final three-dimensional design with the major features of the interior space identified and quantified.

The details of the boundary detection step 30 are shown in FIG. 2B. The steps include first performing basic image pre-processing 36 to eliminate any artifacts in the input. For example, any spurious dots in the input file should be marked as errors and not rendered as interior walls or columns.

Once the pre-processing is complete, the system determines where in the model the walls 37 are to be located. The system determines which walls are likely to be load-bearing and which ones are only small partitions. The system also determines which walls 37 are likely to be full height and which walls do not extend the full height of the room.

Upon defining the walls, the system detects where in the layout the windows 38 are placed. In one embodiment, the windows detection 38 is performed using indications in the input sketch 16. The system 10 supports a large library of window styles, and as part of the window detection 38 the end-user can confirm or change the style of windows on the premises. In one embodiment, the process is iterative so that once the room type is detected as part of type detection step 32, the windows are updated. For example, if the detection 32 indicates that the room is a bathroom, the window type will be set to a translucent window instead of a transparent window.

Finally, as part of the boundary detection step 30, the system also performs door detection 39.

Object Population Step

Figure 3:
FIG. 3 is a flow chart showing the details of the analysis stage.
Figure 3:
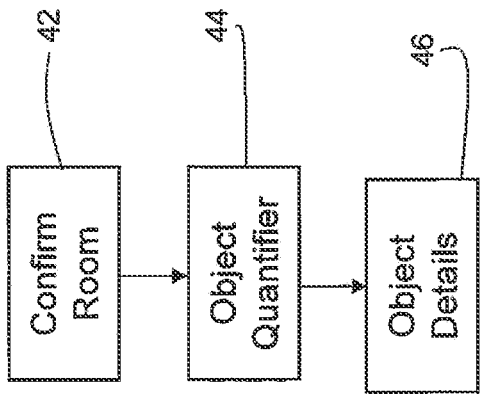

Turning now to FIG. 3, the flow chart of the modification step 20 describes the steps to populate the design with objects.

The population step 20 accepts as input the final three-dimensional design generated by the analysis step 20. The population step 20 begins by confirming the properties of each room 42. In one embodiment for each room, the system 10 confirms room properties, such as light exposure, size of room, and purpose of room.

For each room on the premises, the system 10 employs an object quantifier 44 to select objects. In one embodiment, the objects include fixtures such as appliances, as well as moveable objects such as furniture. The object quantifier is a combination of a server-side and client-side database in one embodiment.

In one embodiment, the object quantifier 44 includes different sets of objects depending on the status of the system 10. For example, the system 10 may be authorized to display objects from only one supplier.

In another embodiment, the end-user controls the available objects in the object quantifier 44, but only if the end-user has paid for an unlimited access version of the client-side application. In yet another embodiment, each end-user has access to a library of objects within the object quantifier 44 depending on the status of the end-user's subscription with the system 10.

In one embodiment, the object quantifier 44 only displays as available physical objects that are available for purchase at a particular location.

Each object which is added to the three-dimensional environment may be customized by setting various object details 46. For example, for flooring objects, the end-user will have the option of selecting multiple colors, textures, and materials. Similarly, for any furniture objects, the end-user may select properties of the furniture such as color, height, and other features.

Each object is designed to be interactive during either a virtual reality review of the design or an augmented reality review of the design.

Details of Design Finalization Process

After acceptance of an interior model at the conclusion of step 20, the user continues with the final customization of the interior, in one embodiment.

In one embodiment, the user can choose to get system suggestions for furniture placement and style or to continue with the integration of 3D furniture models on his own.

If the user chooses system help, in one embodiment, on the basis of detected and defined space, the system creates suggestions of basic furniture placement in each room. In one embodiment, the system employs industry standards and rules, and user's preferences.

The output is a system suggestion to the user where to put furniture, such as a sofa in a living room. The system uses factors such as free space, other room connections, windows and door, positions. Further, the system uses a user preference for the style of sofa in one embodiment. By dragging the suggested furnishings within the interface, the user can change all of the suggested positions and type of furniture.

Further, in one embodiment, the user can add new furnishings, where the system AI will assist the end-user and suggest furniture with similar style and color as one already integrated and in accordance with user preferences.

If a user chose to set up furniture without system assistance, the system will nonetheless suggest furniture to use, in one embodiment. In both cases, user can change position, orientation, type, color, textures of all furniture inside his interior in order to get final 3D model.

After finishing and inserting all desired 3D model of furniture and equipment user can request final processing, such as by requesting a photorealistic visualization 24 or the exported 3d model 25.

Example Interface

Figure 4:
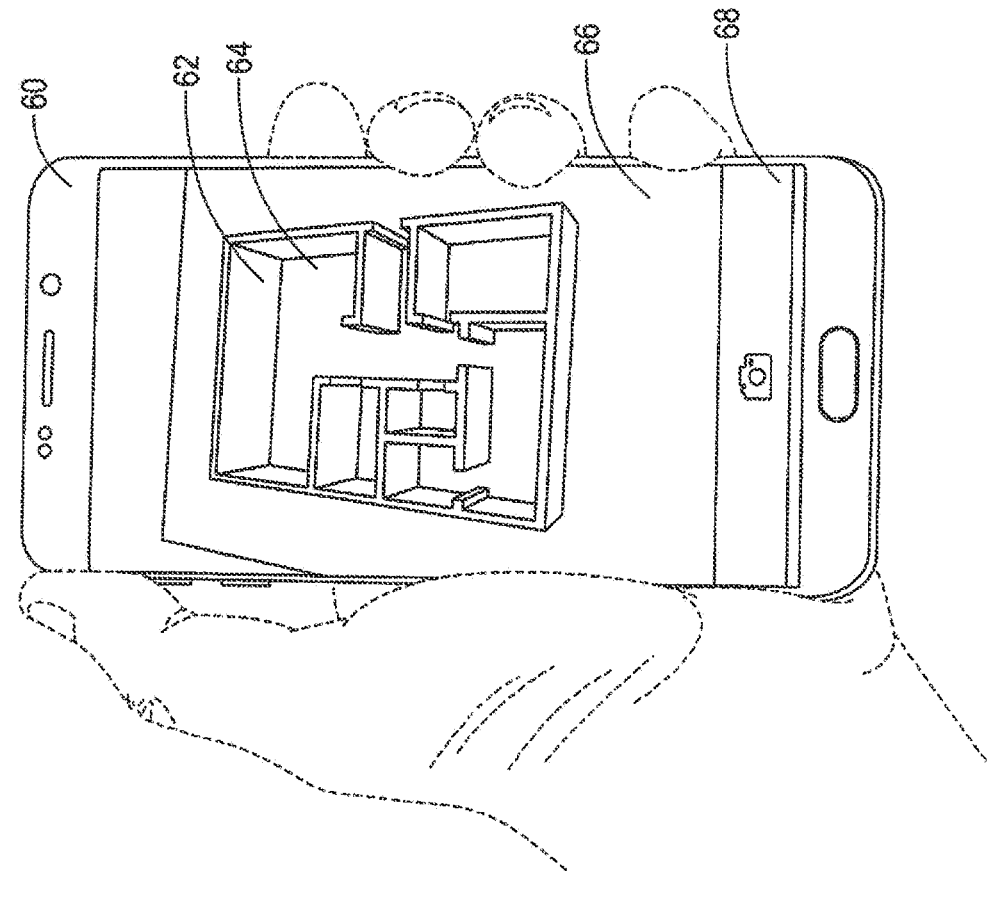
FIG. 4 is an example of a user interface of one embodiment of the invention.

A sample user interface is shown in FIG. 4. As shown in FIG. 4, the system 10 interface shows the step 18 of confirming the layout. The interface is shown on a portable device 60. The system 10 is showing the preliminary design 62 as super-imposed on a photo of the two-dimensional sketch 64. The sketch 64 is drawn on a sheet of paper 66. The sketch fits within the boundaries of the device 60 screen 68.

Figures 5A, 5B, 5C:
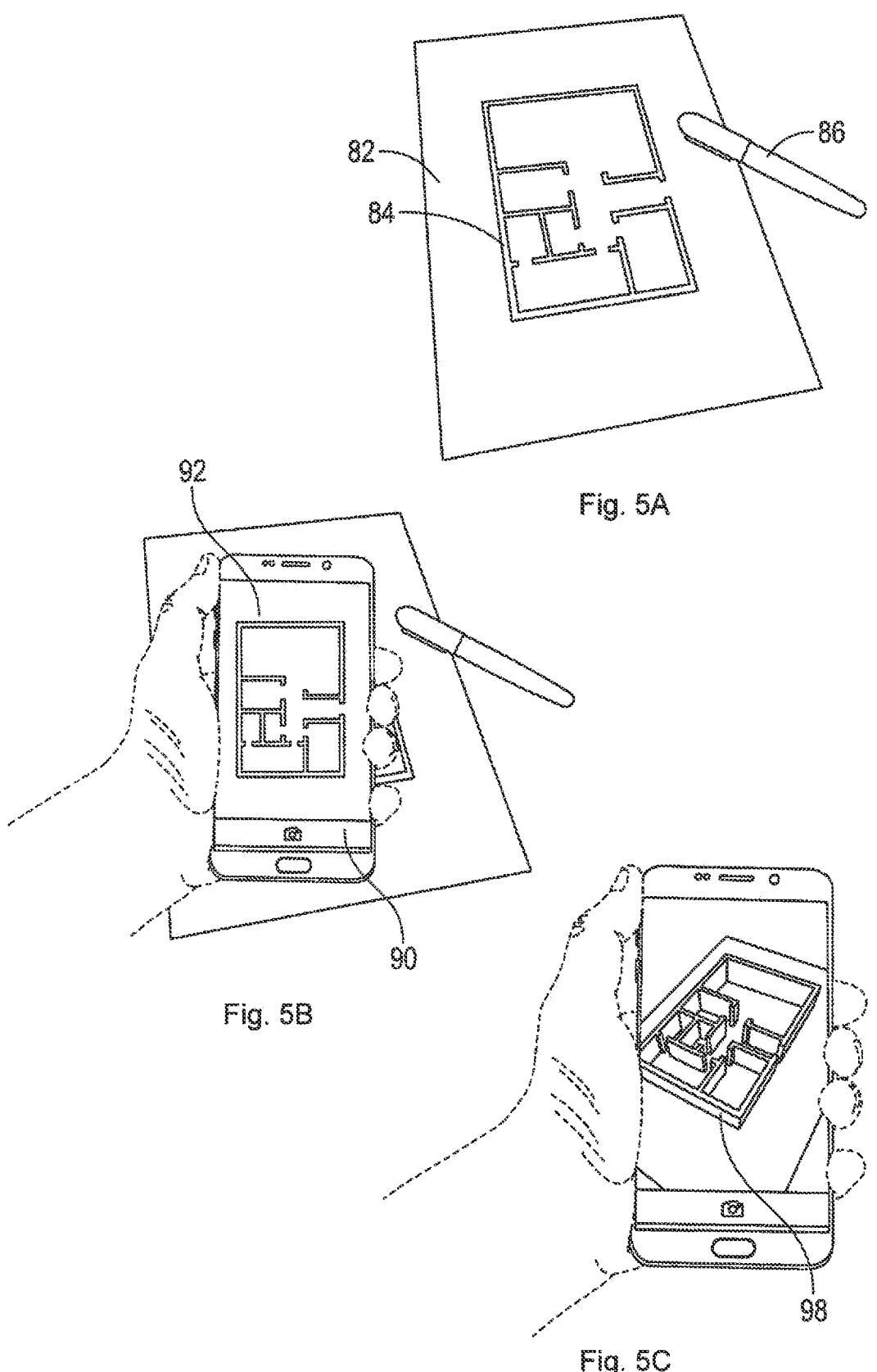
FIGS. 5A-C is an overview of the operation of one embodiment of the invention.

Three phases of the system are depicted in FIGS. 5A-C. First, as shown in FIG. 5A, the end-user draws an informal two-dimensional sketch 82 on a piece of paper 84 using a high-contrast marking instrument 86, such as a marker.

Second, in FIG. 5B, the end-user takes a photo of the sketch using a portable device 90, such as a cell phone. The phone accepts the input of the paper-based sketch 84 and displays the input to the user 92, already rotated and de-skewed. Finally, as shown in FIG. 5C, a three-dimensional design 98 is shown to the end-user, following the detection 20 step. The three-dimensional design 98 is shown in an augmented reality mode by superimposing the design 98 on the photo of the sketch.

Figure 6:
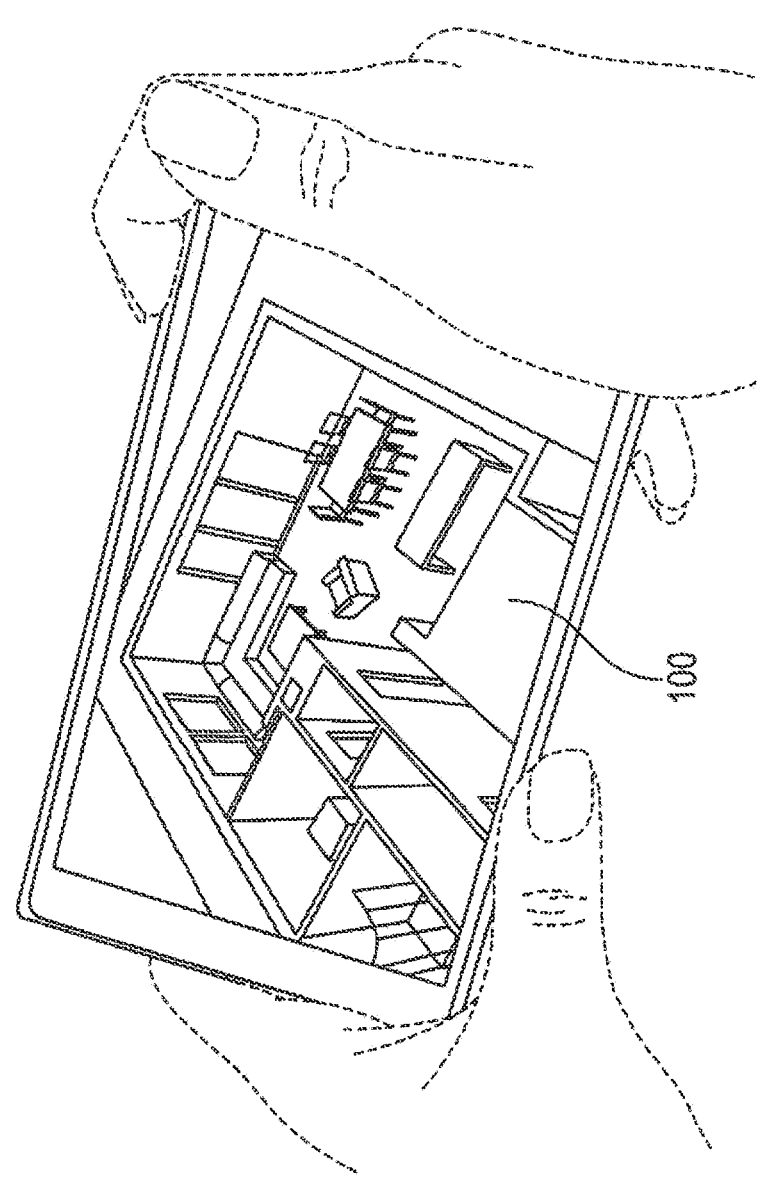
FIG. 6 depicts the output of one embodiment of the present invention.

Turning to FIG. 6, the final design 100 is shown to the end-user, again in the augmented reality mode, depicting the output model on the original sheet of paper.

Design Process Example

Figure 7A:
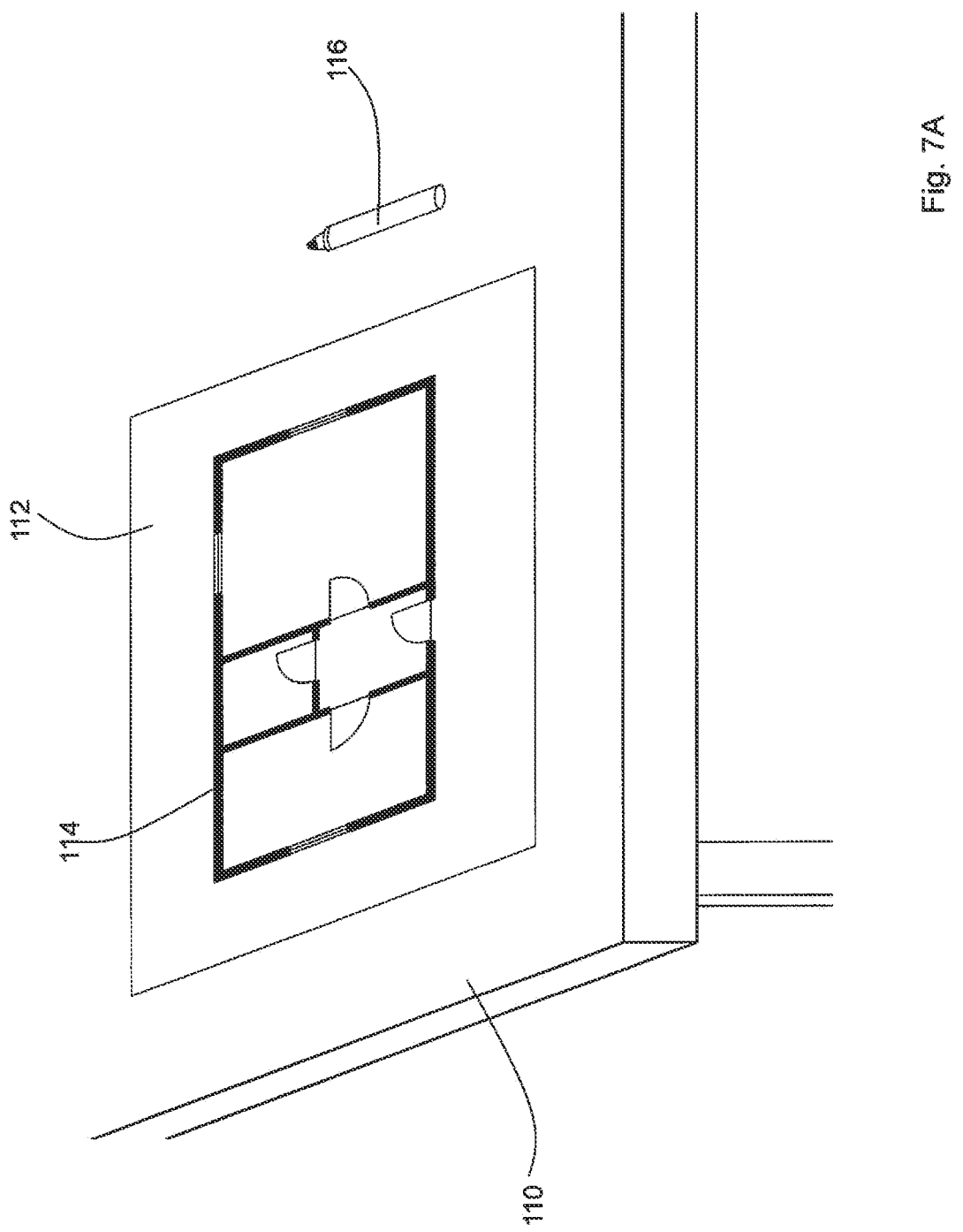
FIGS. 7A-F depict the steps of one embodiment of the invention.

FIGS. 7A-F depict an overview of the design process using one embodiment of the invention. As shown in FIG. 7A, the process begins with a sheet of paper 112 on a work surface 110, such as a table shown in FIG. 7A. The end-user draws a sketch 114 on the paper 112 using a suitable writing utensil 116. While the sketch shown in FIG. 7A depicts features such as doors and windows in a formal manner akin to an architectural drawing, the system accepts as input an informal drawing where the doors and windows are indicated in any number of possible ways. The system is able to infer which user-selected symbols indicate a door or window.

In one embodiment, the system indicates to the end-user if a particular room is unreachable or if too many rooms lack windows, as these may indicate that the design is incomplete.

Further, while the sketch 114 shown in FIG. 7A appears formal; it nonetheless is lacking many architectural details that are not required by the system. For example, sketch 114 does not need to include a formal scale or a legend of symbols.

Figure 7B:

As shown in FIG. 7B, the user thereafter invokes an application on their device 120 which is used to capture a photo or video 116 of the sketch 114. The sketch 114 is thereafter in the memory of the device 120 and can be interacted with using the device 120.

Figure 7C:
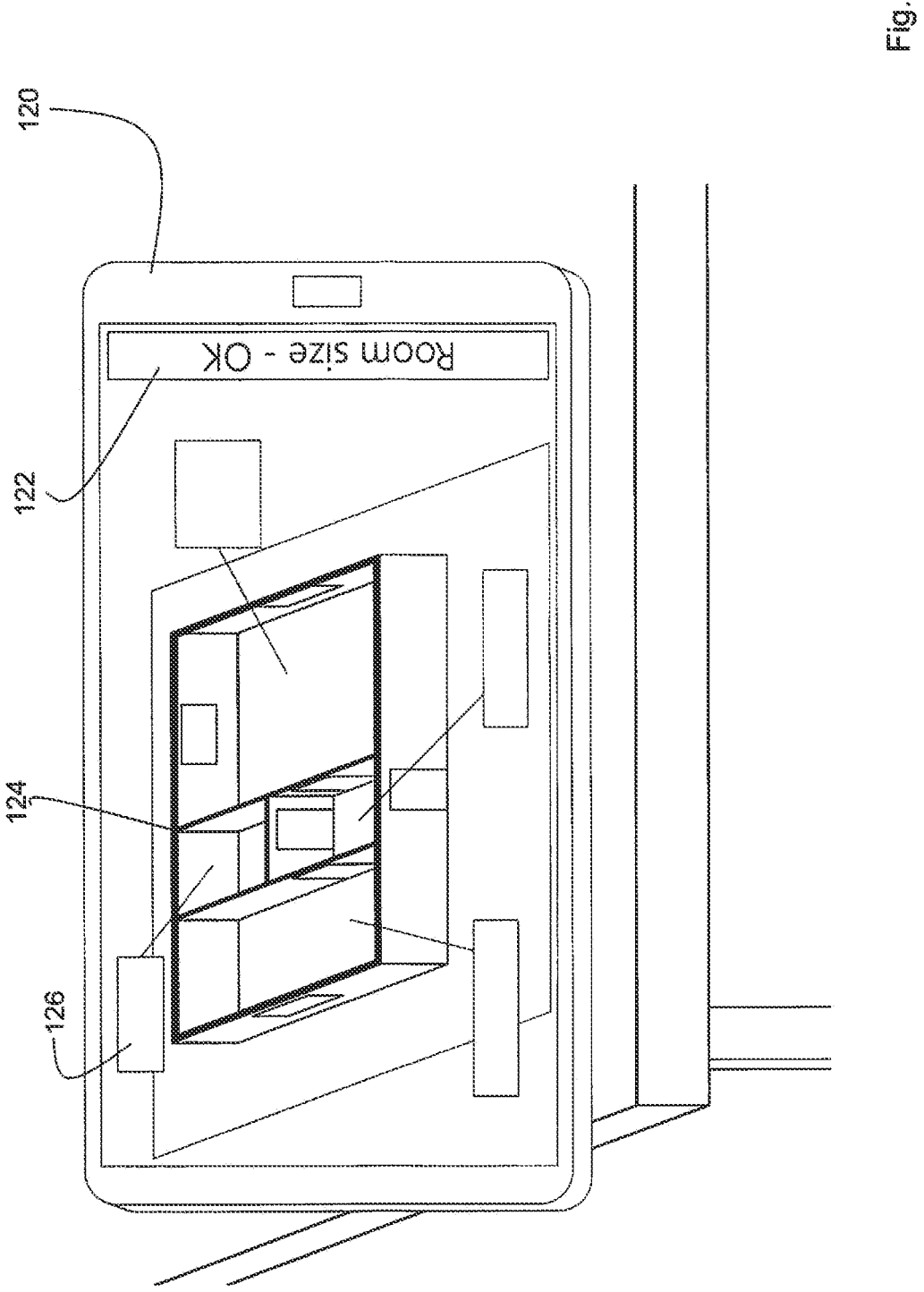

Turning to FIG. 7C, the device 120 thereafter generates a three-dimensional model 124 of the sketch 114. The purpose of each room is indicated 126 to the end-user. The end-user has the opportunity to change the layout by interacting with the three-dimensional model 124 on the device 120 and can also confirm the model 122. As discussed above, to rotate the model 124 of the space, the end-user may rotate the sheet 112 which contains the sketch 114 (visible in FIG. 7A).

Figure 7D:
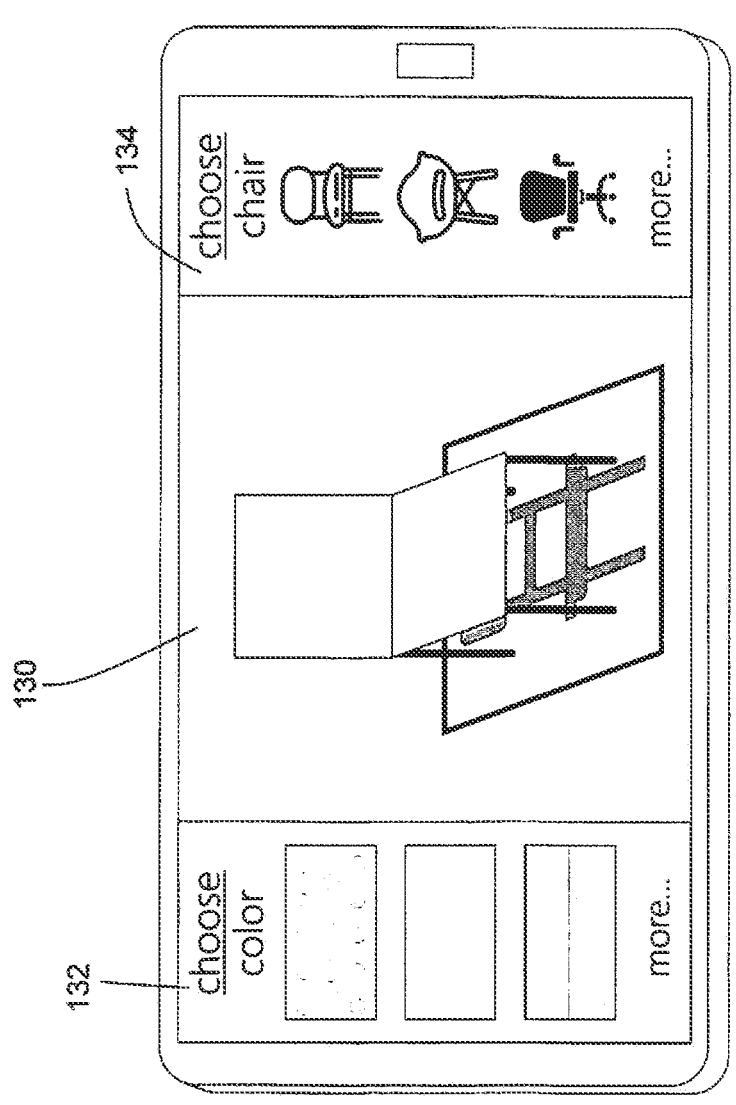

As part of the design process, the end-user is provided with suggestions for objects 130 as shown in FIG. 7D. The end-user may customize the color 132 and type 134 of each object 130 presented to the end-user in the system.

Figure 7E:
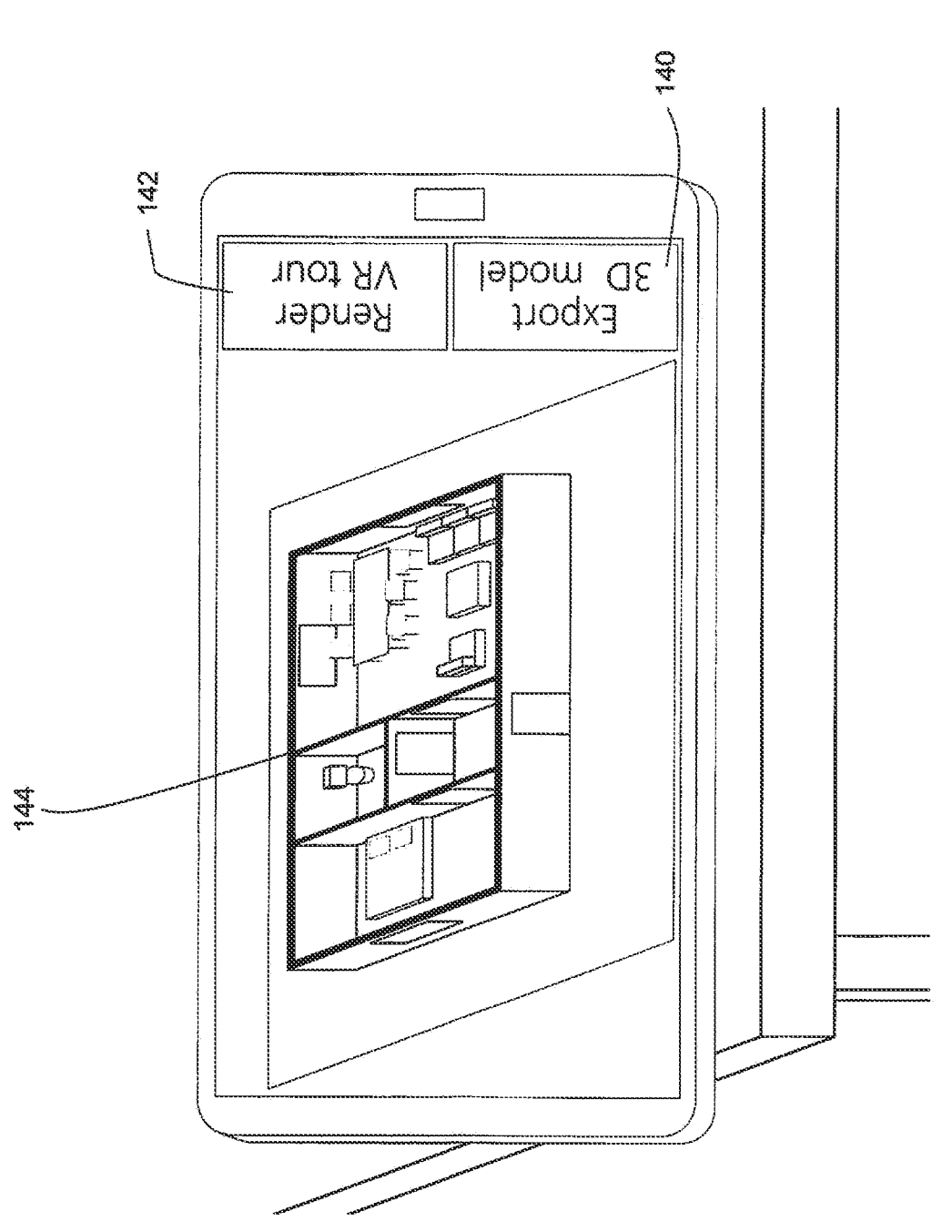

Per FIG. 7E, once the three-dimensional model is populated by objects, the end-user may export the three dimensional model 140 or render a virtual reality tour 142 of the populated model 144.

Figure 7F:
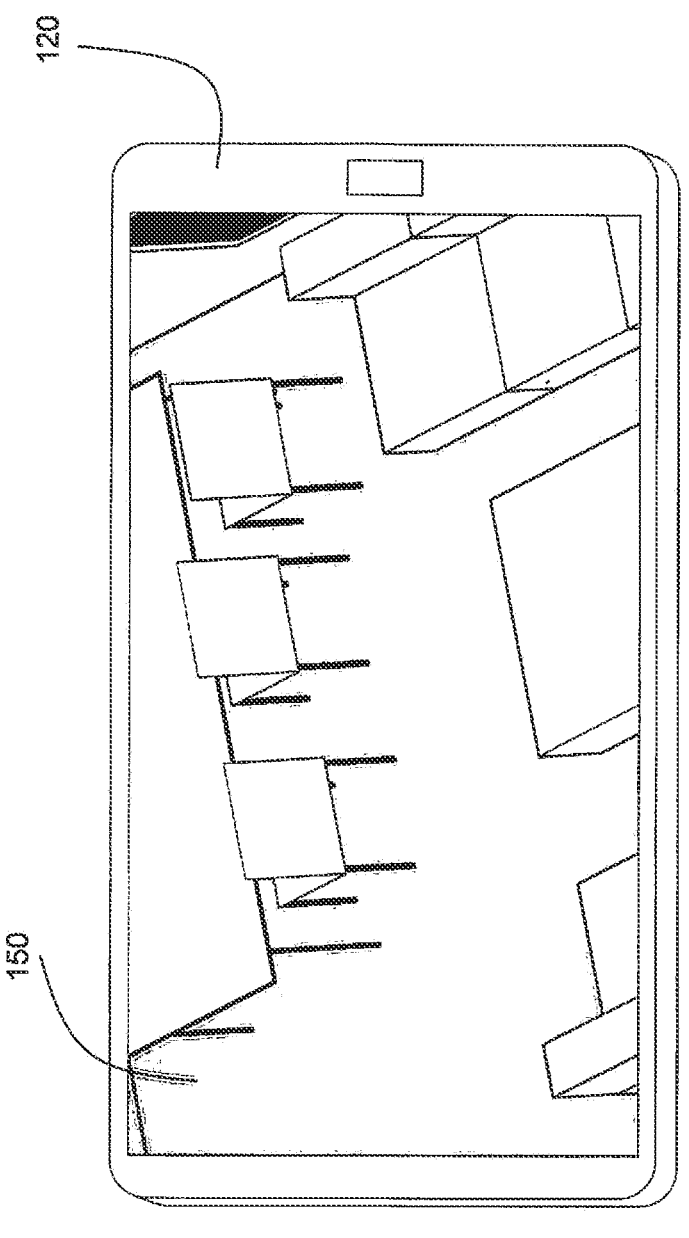

As shown in FIG. 7F, the system will display the virtual reality tour 150 on the device 120. While the virtual reality tour 150 is depicted on the device 120, it is rendered in a remote system, in one embodiment, as described above.

While FIGS. 7A to 7F show consecutive steps, the steps are also iterative, in one embodiment. As such, the end-user may change the physical sketch 114 and the device 120 will re-render the three-dimensional view 124.

On-Demand Rendering in Time-Sensitive Applications

A unique set of challenges are faced by first-responders who have to enter premises in time-sensitive situations, such as persons entering a building in an emergency. In almost all situations, first responders are entering a building for the first time, and have a specific task to accomplish, such as addressing a fire or locating a suspect on the premises. Therefore, they do not have time to become acquainted with building plans, which require interpretation and can be ambiguous. In many instances, first responders, such as fire-fighters, will rely on simple drawings of the premises found in the lobby of the building by the fire alarm station. Those drawings often do not reflect changes in the building due to remodeling. They are also only available for larger commercial buildings, while the majority of emergencies occur in smaller residential buildings.

Figure 8:
FIG. 8 depicts a flowchart of another embodiment of the invention.
Figure 8:
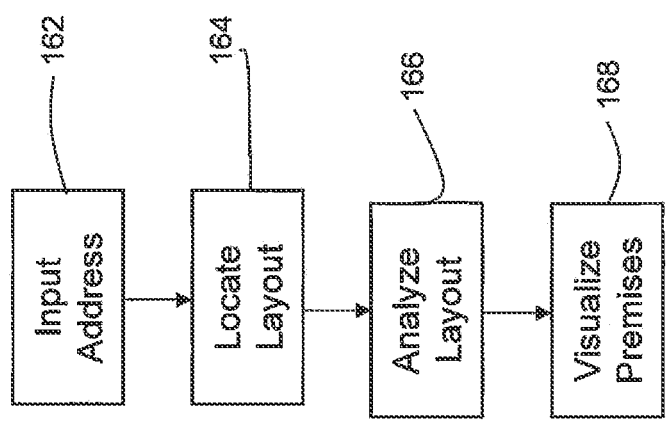

In one embodiment, shown in FIG. 8, the system is used to retrieve two-dimensional plans from a data store, renders the premises in a user-friendly three-dimensional view, and presents the view to the first responders as needed.

As shown in FIG. 8, the on-demand rendering embodiment 160 allows an end-user to input an address 162. The service extends to all indoor locations, encompassing private residences, commercial buildings, and public structures. In one use scenario, the address is input by first responders, such as fire-fighters, responding to an incident at a specific building. In one embodiment, the address input step 162 comprises a manual entry of an address. In another embodiment, the address information is retrieved from a data source, such as an emergency response system, such as the first responder dispatch system.

The embodiment 160 then locates and retrieves the two-dimensional layout of the building 164. In one embodiment, the data store of the layout information 164 is a central municipal repository, such as an office handling building permits. In another embodiment, the layouts are located with private property assessment companies, such as ones that handle insurance assessments. The information of the layout of the premises 164 is securely shared, in one embodiment, for the limited purpose of giving first responders information about the premises. In most instances, the layouts located in step 164 will include varying levels of complexity and most will reflect professional drafting standards. In one version, the system 160 recognizes the type of building layout being analyzed. For example, if the system 160 recognizes that it has retrieved the technical drawings for the building's electrical installation, the system 160 will disregard certain details from the document, such as the location of light fixtures and electrical outlets. Instead, the system will only model the actual layout of the building's interior.

In most instances, the locate layout step 164 will refer to an electronic data store. However, the system 160, in one embodiment, also allows the end-user to provide the system with a photograph of a paper version of the layout.

In one embodiment, the system 160 also attempts to address the situation where the locate layout step 164 was not able to find any plans for the particular address. In one embodiment, the system requires a building plan for the specific premises to be on file. In another embodiment, the system will indicate that exact building plans are not available and perform a broader search of the databases. The search criterion could include properties built by the same developer at about the same time frame. In another embodiment, the system compares the street view of the building with the expected appearance of the front of the building based on the plans on record to ensure that the building plans match up with the current premises.

The system provides elevation estimations, in one embodiment. Elevation information is provided as approximate values, with one embodiment using AI to suggest elevations based on learned models of analogous properties.

Next, using the processes described above, the system 160 will analyze the layout 166. During this step, the system 160 undertakes the same sort of analytical steps as described above, including determining the location of doors and windows, rooms sizes, and types of rooms. The identification of the type of room is particularly useful in an emergency situation, where the responders need to reach the building's bedrooms as quickly as possible.

Finally, after analyzing the layout 166, a visualization of the premises is presented. In one embodiment, the visualization is presented as a 3-dimensional model on a portable device. In another embodiment, the visualization comprises an augmented reality presentation or a virtual reality presentation.

In one embodiment, the visualization 168 includes wayfinding markers, such as arrows, pointing the direction of areas of interest, such as bedrooms.

A benefit of this system is that it can generate a visualization 168 of a building from a wide variety of building plans, on-demand, without altering the original plans or specifically preparing them for this use. The system does not need access to high-quality plans for all buildings in a given city because in one embodiment, it will match plans to similar buildings.

In one embodiment, the system operates in the following steps. First, an individual or a system such as a security contacts the emergency department to inform them of a fire or other incident providing the address either directly or indirectly. Second, the address is sent instantly to at least one database computer system that recognizes the address and find the floor plan. In one embodiment, the step of matching the address to a floor plan uses artificial intelligence. In one embodiment, the floor plans are sourced from multiple datastores. For example, in some jurisdictions, all new developments are required to provide a computer-readable version of final building plans. In another jurisdiction, the source of the plans includes insurance information. For example, a customer will be asked to provide a rendering of the premises as part of acquiring a new insurance policy. In one embodiment, a customer is provided a discount on their insurance policy if they provide this additional information. As such, in this embodiment, the system interacts with information stored in both government-owned data stores and private ones as well.

In one embodiment, the system must find the exact floor plan for the given address as it is not possible to use a similar building's floor plan. In one embodiment, the initial visualization is of the ground floor of the building, with additional floors being visualized as demanded by the response team. In another embodiment, all available floors are visualized.

Third, after receiving the full address, the one or more data stores will send back the floor plan. The system then generates a 3d view of the premises, including information about the space, location of windows, doors, electrical appliances, gas-using appliances, and other relevant information. The fire department or other emergency team receives the information on their way to the location and can view the rendering on any general computing device.

The visualization system described above will automatically create a 3d model on the basis of the floorplan with the position of windows and doors added. The system will read in the position of electrical and gas installations, as well as any other dangerous installations such as chemical storage units on the premises. The positions of the installations will be presented in the 3D model. The final output is a preview of a 3D model with highlighted areas of dangerous places in one embodiment. The presentation occurs on a tablet screen, in one embodiment, or in virtual reality with VR glasses, or in augmented reality using an appropriate smartphone/tablet in combination with AR headwear.

A benefit of this system is that it will permit the intervention team to have a better understanding and evaluate potential flash-over, backdraft, explosion risk, and anticipated air movement that contribute to fire becoming larger or other serious problems such as flash-over during the time the fire-fighters are on the premises. The emergency responders are provided a visualization of interior walls, rooms, windows, gas, and electrical installations. The visualization allows the responders to locate potential victims, reduce the risk of explosion, electrocution, and better prepared to address an emergency such as a fire. In one embodiment, the system provides a complete full 3D visualization within three minutes of receiving the address.

For the embodiments of the property system described herein, a benefit is that homeowners can update or adjust 2D floorplans at any time to reflect changes to the property or to provide a higher-quality input to the system.

In one embodiment, the system is available as standalone software, accessible on portable tablets for emergency responders, enhancing their preparedness and response capabilities.

Insurance Applications

Real estate is frequently insured against a variety of losses or other problems. In one embodiment, the system is used by an insurance company as part of the insurance process in many applications, including, but not limited to, checking the state of the property, verifying that the property is accessible to first responders (as described above), that the property is accurately described in the insurance documents, and that the property insurance matches the type and actual use of the property.

Many regions suffer from a shortage of insurance companies providing real estate insurance services due to increasing and incalculable risk. In one embodiment, the system for first responders is used by an insurance company to pre-generate visualizations of premises to limit the risk of complete loss of a real estate investment due to an emergency on the premises. The insurance company can offer a discount to a customer who maintains a correct and verified visualization on file.

Other applications of a visualization system automate various tasks related to insurance.

Figure 9:
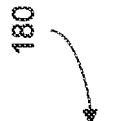
FIG. 9 depicts a further flowchart of another embodiment of the invention.
Figure 9:
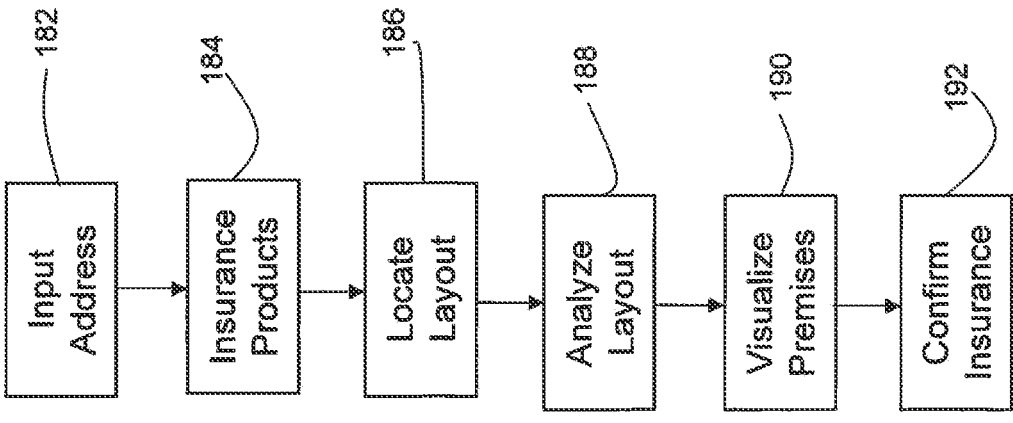

As shown in FIG. 9, an insurance-analysis embodiment 180 starts with an end user inputting an address 182 of a property. The end user also provides information about applicable insurance products 184. The system then locates at least one layout 186 of the property whose address was inputted at step 182. In one embodiment, the at least one layout 186 is retrieved from a data source having informal two-dimensional drawings and the retrieval comprises taking a photograph of a two-dimensional rendering of the premises and a photo of the premises. In this way, the retrieval of the layout 186 combines multiple data sources, for example, building permits or a rendering of the property on a rental listing website, along with a photo of the external elevation of the building. In one embodiment the location of the layout step 186 comprises accessing multiple database from multiple sources, such as the insurance company's own database, but also a commercial street-view database and a satellite image database.

The system analyzes the layout 188 to determine the features of the layout, such as locations of windows and doors, as well as any fixtures, for example, appliances. In one embodiment, artificial intelligence is used to determine what types of appliances are located on the premises. For example, if the layout document 186 indicates that the premises comprise a multi-apartment building, each apartment will be presumed to contain a set of kitchen appliances and their location will be determined using the layout of the premises and visualizations of similar premises.

Further, the layout analysis step 188 includes verifying the physical layout to ensure that it can be physically accommodated within the external footprint of the building. For example, in embodiments where the location step 186 includes finding satellite images of the property, the analysis step 186 will confirm that the stated use of the property matches the roofline of the property.

After the analysis step, the system will generate a visualization of the premises 190. The visualization output 190 is then used by a subsystem to confirm the insurance coverage by the confirmation step 192.

Real estate investments are likely to be affected by evolving threats and other factors. In many regions, the threat of terrorism and other security threats is increasing. Growing population in urban and suburban centers are leading to an increased demand for public safety services. The rising adoption of new technologies, such as artificial intelligence and the Internet of Things, which are enabling new and innovative emergency, security, and insurance solutions. Of particular concern is climate change, which is increasing natural disaster occurrences such as fires, floods and hurricanes.

Increasing demand for home insurance is driven by adverse events including property damage, asset damage or injury to occupants, theft and fire. Changes in demand compel insurance companies to invest in and develop products that offer comprehensive coverage, financial security, and take actions to reduce risks. Furthermore, the increasing occurrence of natural disasters such as wildfires, hurricane, hail, earthquake or floods has contributed to the demand for property insurance.

The implemented solution makes use of technologies such as geolocation, application program interface (API), artificial intelligence (AI), data analytics, blockchain, and big data provides innovative opportunities for insurers in the market. With these technological developments, real estate insurance, distribution platforms are expected to enhance productivity for providing various types of coverage. These include Additional Living Expenses (ALE), Renter's insurance, and others seamlessly at the point of purchase. Moreover, digital transformation enables home insurance companies to create highly personalized user experiences with their customers. Further, to maintain home insurance market position, insurers are considering use of big data analytics that offer possibilities of generating large premiums. In addition, technologies help in data collection, cater to customer specific needs, calculate risk, and detect fraud. Therefore, easy accessibility and convenient home insurance offerings by technological advancements are provide lucrative opportunities for insurers in the home insurance market.

One significant cost for insurance carriers are fires. In the described embodiment, insurance services providers use advanced technologies such as visualization and geolocation to limit risks from fires and to improve performance of first responders during fire emergencies. The technologies used have a number of benefits, including fire alarm warning, fire security detection, fireproof skeleton protection, by employing artificial intelligence (AI), fingerprint, blockchain, and analysis of large datasets.

The technology described herein gives market underwriters new ways of doing business. Important tasks such as averaging policy, consequential loss policy, claim policy, and others, faster and more accessible at the point of sale. Additionally, digital transformation enables fire insurers to provide highly personalized user experiences to their customers. To maintain their position in the global fire insurance market, insurance companies are looking at using big data analytics, which helps them charge appropriate premiums. Technologies help collect data to meet individual customer needs, calculate risk, and detect fraud. Therefore, technological advances that make fire insurance easier to buy and use more conveniently create good business opportunities for insurers.

Figure 10:
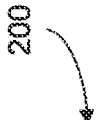
FIG. 10 depicts an additional flowchart of another embodiment of the invention.
Figure 10:
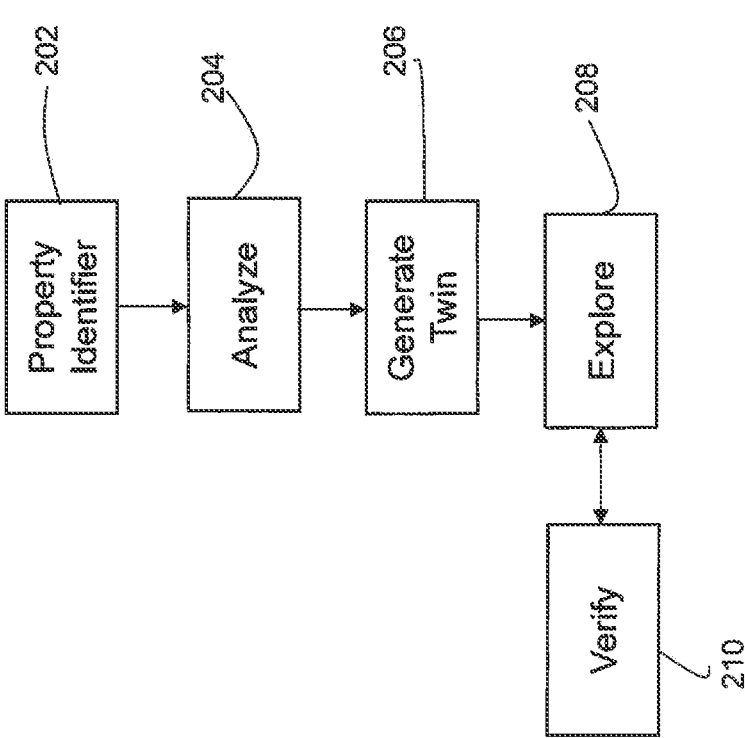

In one embodiment, shown in FIG. 10, the system 200 is used to generate a digital twin of the property being analyzed. First, a property identifier 202 is provided, which is used to analyze 204 the property as per the process 180 described in FIG. 9. A digital twin 206 is generated and then explored 208. This digital twin 206 is explored 208 as a virtual representation of the physical spaces, enhancing indoor mapping applications and provides a virtual space to simulate scenarios and assisting in predictive maintenance as well as provide a way to ensure physical space optimization. In at least some embodiments, described below, the digital twin is also used to verify 210 certain aspects of the property and insurance coverage.

Confirmation of Insurance Coverage

In one embodiment, the confirmation step 192 performs a number of functions, using the visualization output of step 190, and external data sources. The verification includes collecting policy information and contacting the insurance provider to verify the validity of the coverage. The system will also check the scope of coverage to review the policy to ensure that it provides coverage for the specific real estate property, including coverage limits and potential risks and liabilities. The system will also check any policy exclusions; for example, the visualization may indicate that the premises are being used for mixed-use purposes, which are excluded from coverage. The system can also check policy endorsements or riders that apply to the property to see if they cover the specific design issues for the property.

The verification can also check the insurance company's claims history to see if there have been recent claims filed for the property. For example, if the property visualization shows that the property has a flat roof with no shingles, but the property owners have filed claims for replacement of damaged roofing shingles.

In one embodiment, the verification also compares the visualization with the information about the property found in the insurance documents, for example, verifying the size of the insured property, the number of rooms, and the age of the building. The verification includes checking the visualization against photographs of the exterior of the building found at third-party data stores, such as a street view database or a real estate tax authority.

Ancillary Insurance Company Services

The embodiment 180 allows a primary insurance company to provide additional services at various stages of the insurance process.

In one embodiment, the visualization is used to perform risk assessment and mitigation. For example, in one embodiment, the insurance company uses the visualization to assess potential risks to a greater level of accuracy. The company can evaluate factors such as fire hazards, accessibility to emergency services, and layout of the premises. In one embodiment, the model is used to assess the condition of buildings, identifying potential weak points where maintenance issues could occur and structural issues that require monitoring to maintain coverage. The information is used to help both the insurance company and the insured party.

The visualization is also used during underwriting and renewal of insurance to ensure precise determination of replacement costs, the price of the policy, and coverage limits based on the features of the building. The visualization allows for customized policies that align with the unique characteristics of the building. This embodiment is particularly useful for unique buildings.

A visualization generated by an insurance company can be shared with the customer to mitigate risks and engage the customer in taking proactive steps to reduce risks. For example, the customer could be reminded to check on the status of fire detection or suppression systems and check for damaged delivery lines, such as natural gas lines going to appliances.

In one embodiment, the visualization is used by an insurance company to screen potential consumers or property owners prior to offering them comprehensive insurance solutions.

When an insurance company generates many visualizations for the properties it is insuring, the company can spot property risk trends. For example, visualizations can show what type of residential property roof is most likely to result in claims for roof damage during inclement weather.

Providing a 3D visualization to an insurance company allows the company to offer more accurate coverage, reduce risks, and enhance the overall customer experience. It also helps the company remain competitive in challenging markets.

Reinsurance Companies

The embodiment 180 is also applicable to reinsurance companies. Reinsurance companies help primary insurers and property owners mitigate financial risks by taking a part of the risk in exchange for premiums. The reinsurance companies can use the embodiment 180 to verify information about the properties subject to reinsurance by verifying and confirming that the primary insurance is sufficient, per the analysis step 192. As described above, many of the analysis steps occur in an automated system, and so a reinsurance company providing secondary coverage to many premises can verify the accuracy of insurance information using the embodiment 180.

A benefit of the embodiment 180 by a reinsurance provider is that it can provide services on a larger scale and can automate its risk assessment tasks. The embodiment 180 can provide customized solutions for property owners and primary insurance companies. The embodiment 180 can also be used by reinsurance companies to verify the work of the primary insurance companies.

In at least one embodiment, the system facilitates a reinsurance company to broaden the geographic scope of its services, providing coverage for real estate investments in geographic regions distant from its home jurisdiction. The embodiment 180 allows the insurance company to control risk by analyzing the properties it is re-insuring, allowing for greater financial stability within a real estate market.

Medical Insurance Market

The system described herein can be used for Medical Insurance by providing visualizations during the delivery, selection of medical insurance plans, as well as detection of fraud. One of the factors preventing expansion is insurance fraud, which has led to strict government verification standards. For instance, bogus claims for accidents that never happened, exaggerated claims for deaths, and a lack of understanding of the value of insurance in developing and poor nations would all have a detrimental effect on market growth. Less than half of the population has health insurance in developing nations, and in many countries only a small minority has health insurance.

For example, the 3D visualization can be used to ensure that a medical provider's office is of a sufficient size to care for the number of patients for whom claims are submitted. A common source of fraud is claiming care for more patients than can rationally be accommodated in a given space and working time. The system described herein uses artificial intelligence to determine if insurance claims are in line with the facility submitting the claims, flagging suspicious behavior from patterns of submissions.

The introduction of new products and plans options by health insurers contributes to trend in the market for health insurance. One can add single disease packages to basic insurance from several firms, which exclusively cover one ailment like high blood pressure, diabetes, or cancer.

These businesses' flexibility benefits their clients by making switching between insurance providers simpler. The increased usage of the internet has also improved the convenience of insurance distribution. Due to the ability for customers to compare various policies and make informed decisions, Insurtech and online sales of insurance policies have emerged as the most practical distribution method for businesses and have been a major contributor to participation growth in recent years.

Alarm and Alert Systems

Another application for the system described herein is to enhance a home security or other alarm system. The system interacts with a number of wireless technologies and sensors to improve the visualizations. The emergence of the Internet of Things (IoT) and wireless technologies: IoT-based security systems ensure safety through the immediate notifications sent to users. The smart sensing detects variances in motion, heat, and so und and alerts the user. IoT makes the devices more sophisticated with the availability of a large volume of high-quality data. Thus, the introduction of IoT devices and effective wireless communication are expected to fuel the adoption of home security systems with multifunctional security options.

In one embodiment, the system implements artificial intelligence (AI) and deep learning to improve and add functionality to home security systems: an AI has paved the way for automated health assessment and medical alert systems to be integrated with a complete home security system. The cognitive and physical health monitoring of the residents is also gaining traction, especially home-based monitoring of the elderly. When used as an integrated part of the home security system, a medical alert system helps in several other ways. It can also be used to alert the monitoring station in case of other emergencies, such as burglary, intrusion, and gas leaks.

By using a cloud-based visualization system, the system overcomes a number of challenges. These include high installation, maintenance, and operational costs: The adoption of home security solutions is significantly affected by the cost associated with the hardware, software, and services. Additionally, software powered with advanced analytics features are expensive and adds up to overall cost of the system.

Mandatory fire protection and safety regulations in certain regions, such as in North America, have encouraged builders to implement fire protection systems in their building structures. Several fire protection systems and equipment manufacturers in this region offer smoke detectors, flame detectors, heat detectors, sprinklers, extinguishers, fire alarms, sirens, control panels and interfaces, fire analysis software, and many other systems. North America is a pioneer in the adoption of video surveillance safety. There is constant progress in the adoption of new technologies, such as the IP-based video surveillance system, which is coupled with a 3D visualization system, in one embodiment.

Stand-alone medical alert systems can also benefit from the system described in this application. Medical alert systems are enhanced medical devices designed to offer a fast and more reliable way for elders and users with health issues to communicate with medical services in the case of an emergency.

The system would apply to the development of intelligent healthcare equipment, and integration of Machine learning (ML), Internet of Things (IoT) Artificial Intelligence (AI) and other related technologies in medical devices all offer new opportunities for growth.

It is to be understood that the above description is intended to be illustrative and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods, certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

An exclusive property right or privilege is claimed in the invention as defined by the following claims:

1. A system for verifying insurance coverage for a premises using visualization comprises:
   receiving an address of a property into a central system;
   receiving information about at least one insurance product into the central system applicable to the premises;
   the central system retrieving an informal two-dimensional rendering of the premises from at least one external data store;
   the central system analyzing said informal two-dimensional rendering;
   the central system determining features found on the premises depicted by the two-dimensional rendering, wherein said features comprise walls, doors, windows, and appliances;
   the central system employing an artificial-intelligence engine configured to autonomously perform the retrieval, analysis, feature-detection, and model-generation steps;
   the central system automatically generates a three-dimensional model of the premises on demand for use by an insurance provider only the two-dimensional rendering of the premises and without requiring aerial imagery;
   the central system generating a high-resolution photorealistic and 360-degree interior visualization including technical information comprising detected walls, windows, doors, room boundaries, and structural features; and
   the central system generates an insurance risk assessment report adapted to allow the insurance provider to verify insurance coverage for the property using the three-dimensional model generated by the system.

2. The system of claim 1 wherein the central system employs an AI-based anomaly detector to compare the generated three-dimensional model to historical or expected property layouts and to flag mismatches indicative of potential fraud or data errors.

3. The system of claim 1 wherein the visualization is deliverable to a smartphone, tablet, portable computer, or AR/VR-capable wearable device.

4. The system of claim 1 wherein the high-resolution visualization comprises a photorealistic rendering of interior spaces with embedded technical information including room dimensions and structural features.

5. The system of claim 1 wherein the artificial-intelligence engine performs boundary detection, wall detection, window detection, door detection, and room-type prediction.

6. The system of claim 1 wherein the insurance risk assessment report is configured for use by an insurance provider to evaluate eligibility for insurance coverage.

7. The system of claim 1 wherein the three-dimensional model is generated solely from the informal two-dimensional rendering without requiring aerial imagery or external spatial data.

8. The system of claim 1, wherein the retrieval, analysis, feature-detection, model-generation, and visualization steps are performed without use of sensors, including without use of range-finders, depth sensors, LiDAR sensors, motion sensors, or environmental sensors.

9. A system for generating formal premises designs for insurance analysis at an address comprising:

the system retrieves address information and insurance information associated with the address;

the system obtains initial data from at least one external data source on basis of the address information;

the system receives input comprising the initial data to represent one or more premises;

the system analyzes said input to generate a three-dimensional model;

the system employs an artificial intelligence engine configured to autonomously perform the retrieval, analysis, feature detection, and model generation steps;

the system modifies the three-dimensional model;

the system determines features found on the premises, wherein said features comprise walls, doors, windows, and appliances;

the system automatically generates a final three-dimensional digital twin model of the premises using only the initial data from at least one external data source and without requiring aerial imagery, the digital twin highlighting areas relevant to insurance coverage;

the system generates a high-resolution photorealistic visualization of the premises including detected structural features;

the system automatically generates a final three-dimensional digital twin model of the premises; the digital twin being generated using only the initial data from at least one external data source highlighting areas relevant to insurance coverage;

the system generates a photorealistic visualization of the premises; and the system provides an insurance risk assessment report, including a preview of the photorealistic visualization of the premises generated by the system adapted for purposes of verifying of insurance coverage by an insurance provider.

10. The system of claim 9 wherein said initial data comprises a photo of a 2-dimensional sketch on paper.

11. The system of claim 9 wherein said initial data comprises a video of a 2-dimensional sketch on paper.

12. The system of claim 9 wherein said initial data comprises an existing three-dimensional model as a baseline.

13. The system of claim 9 wherein said initial data comprises importing a completed three-dimensional model.

14. The system of claim 9 wherein system modification employs artificial intelligence to generate the three-dimensional model.

15. The system of claim 9 wherein said final three-dimensional model is populated by one or more interactive objects.

16. The system of claim 9 wherein said previewing of the photorealistic visualization occurs using augmented reality.

17. The system of claim 9 wherein said previewing of the photorealistic visualization occurs using smart glasses.

18. The system of claim 9 wherein said analysis of input confirms that each room depicted in the premises is a valid room.

19. The system of claim 9 wherein said analysis requests user input to confirm proper detection of rooms within depicted premises.

20. The system of claim 9 wherein said analysis comprises detection of doors and windows within the input design.

21. The system of claim 9 wherein the system employs artificial intelligence to match an input address to candidate two-dimensional layouts by ranking multiple candidate layouts using a learned similarity model.

22. The system of claim 9, wherein the system performs the retrieval, analysis, feature-detection, model-generation, and visualization steps without use of sensors, including without use of range-finders, depth sensors, LiDAR sensors, motion sensors, or environmental sensors.

* * * * *